(12) United States Patent
Gruner et al.

(10) Patent No.: US 7,068,436 B2
(45) Date of Patent: Jun. 27, 2006

(54) PROJECTION LENS FOR A MICROLITHOGRAPHIC PROJECTION EXPOSURE APPARATUS

(75) Inventors: Toralf Gruner, Chemnitz (DE); Hans-Jürgen Mann, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/878,611

(22) Filed: Jun. 29, 2004

(65) Prior Publication Data
US 2005/0018312 A1    Jan. 27, 2005

(30) Foreign Application Priority Data
Jul. 1, 2003    (DE)    ................ 103 29 793

(51) Int. Cl.
*G02B 13/24*    (2006.01)
(52) U.S. Cl. .............. 359/649; 359/722; 359/723; 359/738; 355/71
(58) Field of Classification Search ........ 359/649–651, 359/707, 722–723, 738; 355/71, 55
See application file for complete search history.

(56) References Cited

U.S. PATENT DOCUMENTS

| | | | |
|---|---|---|---|
| 5,222,112 A | 6/1993 | Terasawa et al. | |
| 5,231,471 A * | 7/1993 | Torigoe | ..................... 356/401 |
| 6,061,188 A | 5/2000 | Kamon | |
| 6,245,470 B1 | 6/2001 | Kamon | |
| 6,252,712 B1 | 6/2001 | Fürter et al. | |
| 6,268,903 B1 | 7/2001 | Chiba et al. | |
| 2001/0010886 A1 | 8/2001 | Kamon | |
| 2002/0085286 A1* | 7/2002 | Drodofsky et al. | ......... 359/619 |
| 2003/0011896 A1 | 1/2003 | Shiraishi | |
| 2003/0099034 A1 | 5/2003 | Mann et al. | |
| 2003/0234981 A1 | 12/2003 | Hoffman et al. | |
| 2004/0105170 A1 | 6/2004 | Krahmer et al. | |

FOREIGN PATENT DOCUMENTS

| | | |
|---|---|---|
| DE | 198 07 120 A1 | 8/1999 |
| WO | WO 02/093209 A2 | 11/2002 |
| WO | WO 02/099500 A2 | 12/2002 |

* cited by examiner

*Primary Examiner*—Scott J. Sugarman
*Assistant Examiner*—Darryl J. Collins
(74) *Attorney, Agent, or Firm*—Sughrue Mion, PLLC

(57) ABSTRACT

A projection lens (10) for a microlithographic projection exposure apparatus has a first optical element, for example a birefringent lens (L2), that has polarization dependent properties causing intensity fluctuations in an image plane of the projection lens. These fluctuation may be produced by a second optical element (24), for example a polarization selective beam splitting layer (28), that is arranged downstream of the first optical element. A gray filter (32; 132; 232) disposed in the beam path reduces the intensity fluctuations.

12 Claims, 2 Drawing Sheets

PROJECTION LENS FOR A MICROLITHOGRAPHIC PROJECTION EXPOSURE APPARATUS

The following disclosure is based on German Patent Application No. 10329793.6, filed on Jul. 1, 2003, which is incorporated into this application by reference.

BACKGROUND OF THE INVENTION

1. Field of the Invention

The present invention plates to a projection lens for a microlithographic projection exposure apparatus. Such apparatuses are used for manufacturing microstructured devices such as integrated circuits.

2. Description of Related Art

In numerous optical systems, a high imaging quality requires that the light passing through the optical system is in a defined polarization state over the entire beam cross section. Since said defined polarization state does not necessarily have to be constant over the beam cross section, this requirement is also referred to as "defined polarization distribution". If disturbances of said defined polarization distribution occur, it can result in unacceptable imaging errors and/or in contrast losses in the image plane of the optical system. Such disturbances may be caused, for example, by polarization-dependent reflecting layers or birefringent lens materials.

This issue has become particularly important in connection with microlithographic projection exposure apparatuses, such as those that are used, for instance, to produce large-scale-integrated electrical circuits. In the projection lenses of such apparatuses lens elements composed of fluorite ($CaF_2$) crystals are increasingly being used since this material is still highly transparent even if the projection light has a wavelength in the deep ultraviolet (DUV) spectral range. However, fluorite crystals are naturally (i.e. intrinsically) birefringent at such short wavelengths; in addition, a so-called stress-induced birefringence that is caused by mechanical stresses in the crystal lattice may occur.

If it is not possible to suppress the stress-induced birefringence by suitable measures and to achieve compensation for the retardance caused by intrinsic birefringence, the disturbances in the polarization distribution caused by these effects have the result that aberrations occur in the desired intensity distribution downstream of a polarizing optical element. Here, optical elements are referred to as "polarizing" whose reflectance and/or transmittance depends on the polarization direction of the light.

If, for example, the object plane of a projection lens of a microlithographic projection exposure apparatus is uniformly illuminated and a disturbance of the polarization distribution occurs, undesirable local intensity fluctuations occur downstream of a polarization-selective beam-splitter layer that is transparent to light having undisturbed polarization. This is due to the fact that those light components having a disturbed polarization cannot pass through the beam-splitting layer. The intensity fluctuations may result in a non-uniform illumination and, in particular, in fluctuations in the line widths of a photosensitive layer to be exposed in the image plane of the projection lens. Such fluctuations in the line widths reduce the clock frequencies of the large-scale-integrated electrical circuits and are therefore undesirable.

For the reasons mentioned, attempts are being made to avoid the occurrence of disturbances in the polarization distribution from the outset. To compensate for the delays caused by intrinsic birefringence in certain polarization directions, it has been proposed, for example, to dispose the crystal lattice of the fluorite crystals in certain orientations with respect to one another. Details relating thereto are to be found in WO 02/099500 A2, US 2003/0011896 A1 and WO 02/093209 A2. Complete compensation for disturbances in the polarization distribution caused by intrinsic birefringence is, however, generally not possible by means of these measures.

Another approach to preventing intensity fluctuations that occur upstream of a polarizing element as a result of disturbances in the polarization distribution has been disclosed in U.S. Pat. No. 6,252,712. A correction device compensates for disturbances in the polarization distribution. To this end, the correction device has a plate that is introduced into the beam path of the projection lens. The plate is made of magnesium fluoride and is thus birefringent. The thickness of the plate varies locally, which results in a position-dependent compensation effect. Said known correction device is consequently suitable, for example, for compensating for residual disturbances in the polarization distribution that continue to exist despite favorable orientation of the crystal lattice of birefringent crystals.

In order to be able to compensate for as general a class as possible of polarization disturbances, the use of two birefringent plates whose major axes are rotated through 45° with respect to one another is furthermore proposed therein. Since the thickness fluctuations affect not only the polarization, but to an even greater extent the wave-front pattern of the light passing through, a quartz plate for wave-front compensation is provided for each correction plate. The quartz plates have, in turn, thickness fluctuations that vary, however, in a complementary way to those of the correction plates. However, it is precisely these additionally necessary measures that render the correction device disclosed in DE 198 07 120 A1 relatively expensive.

SUMMARY OF THE INVENTION

It is therefore an object of the invention to improve a projection lens in such a way that the undesirable effects of disturbances in the polarization distribution can be reduced at low expense.

According to the invention, this object is achieved by a projection lens having has a first optical element, for example a birefringent lens, that has polarization dependent properties causing intensity fluctuations in an image plane of the projection lens. These fluctuation may be produced by a second optical element, for example a polarization selective beam splitting layer, that is arranged downstream of the first optical element. A gray filter disposed in the beam path reduces the intensity fluctuations.

In this connection, a grey filter is understood to mean any optical element that can alter the intensity of light to which the grey filter is exposed. In particular, a transmissive optical element having local varying transmittance or, alternatively, a reflective optical element having locally varying reflectance is suitable as a grey filter. Preferably, the grey filter does not modify the phase distribution of projection light passing through it.

The invention is based on the insight that it is possible at certain points within the projection lens to compensate for the intensity fluctuations caused by disturbances in the polarization distribution downstream of a polarizing optical element. For example, if a light ray having a disturbed polarization and a light ray having an undisturbed polarization are incident on a polarizing optical element whose transmittance is greatest for light having undisturbed polarization, the light ray having the disturbed polarization is attenuated on passing through the polarizing element. The intensity fluctuation associated therewith between the two light rays can, however, be reduced according to the invention if the intensity of the light ray having the undisturbed polarization is systematically attenuated by means of the grey filter to such an extent that both light rays have the same intensity downstream of the polarizing optical element.

Since light rays having disturbed polarization and light rays having undisturbed polarization generally mix to an increasing extent downstream of an optical element causing the disturbance, far away from said optical element, there is generally no longer any point within the projection lens at which only the light rays having undisturbed polarization can be systematically attenuated by means of the grey filter.

It is therefore preferred to dispose the grey filter as near as possible to or even on the first optical element that generates the disturbance of the polarization distribution. In the immediate vicinity of said optical element causing the disturbance, the light rays having disturbed polarization distribution and having undisturbed polarization distribution are spatially so far apart that the light rays having undisturbed polarization can be systematically attenuated with the grey filter.

If mounting the grey filter on the first optical element or in its immediate vicinity is not possible, an arrangement of the grey filter in the beam path between the first optical element and the second optical element is preferred.

The invention can be used particularly advantageously in catadioptric projection lenses, in which, to reduce the chromatic aberration, the projection light is coupled into a catadioptric section with the aid of a beam-splitter cube, reflected there by an imaging mirror and coupled out of the section again via the beam-splitter cube. Large aperture angles that cause severe disturbances in the polarization distribution if fluorite crystals are used as lens material owing to intrinsic birefringence frequently occur in the catadioptric section. If the beam splitter is polarization-selective, it acts as an analyzer, with the result that projection light emerging from the catadioptric part has intensity variations downstream of the polarization-selective beam-splitter layer. If, according to the invention, a grey filter is disposed preferably inside the catadioptric section, the intensity fluctuations can be substantially suppressed.

Since the polarization distribution also depends on the illumination-angle distribution in the object plane of the projection lens, it may be expedient to dispose the grey filter interchangeably in a filter holder. In this way, it is possible to achieve a uniform illumination of the photosensitive layer in the image plane by inserting grey filters matched to the illumination-angle distribution for different operating conditions.

Advantageously, however, the invention can be used not only in dioptric or catadioptric projection lenses, but also in purely reflective projection lenses, such as those that are designed for extremely short wavelengths in the X-ray range. The mirrors provided there have highly reflective layer systems whose reflectance depends both on the polarization and also on the angle of incidence of the incident light rays. These reflective layer systems therefore cause disturbances in the polarization distribution and are at the same time polarizers that cause intensity fluctuations.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
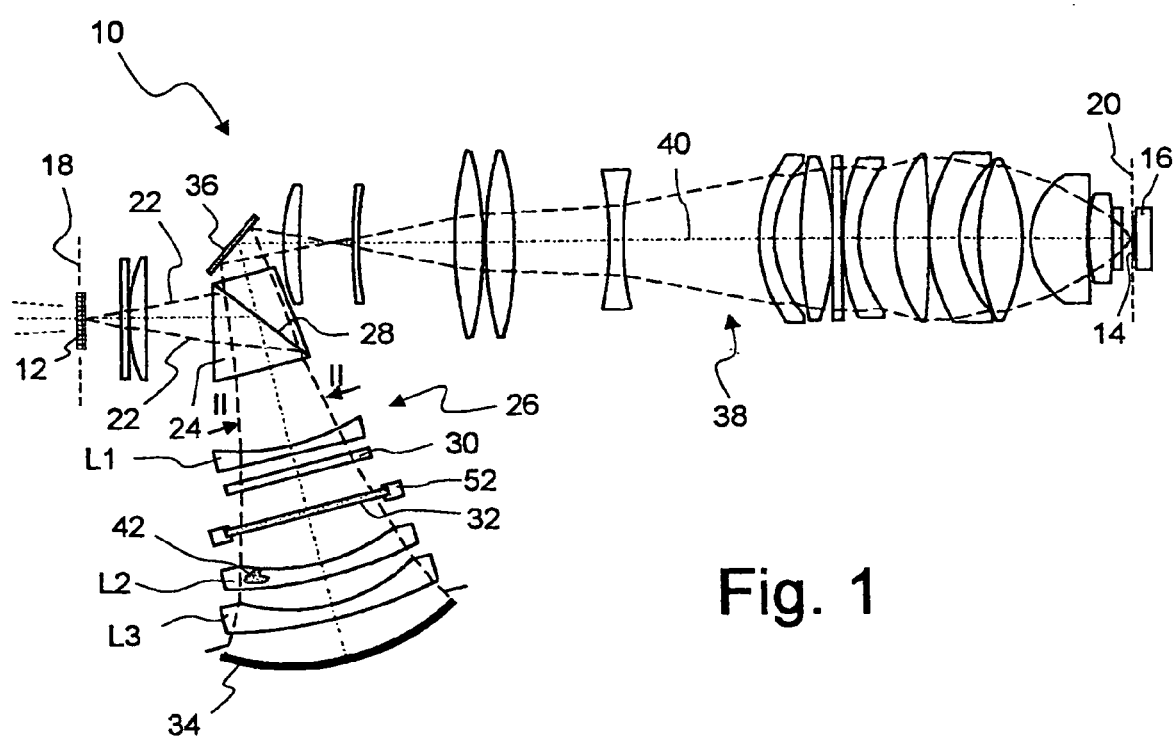
FIG. 1 shows a simplified diagram of a projection lens according to the invention for a micro-lithographic projection exposure apparatus in a meridional section.

FIG. 1 shows, in simplified form, a projection lens of a microlithographic projection exposure apparatus in a meridional section. The projection lens, which is denoted in its entirety by 10, is provided to image, in a reduced form, structures contained in a reticle 12 on a photosensitive layer 14 that is deposited onto a substrate 16. The reticle 12 is disposed in an object plane 18 and the photosensitive layer 14 is disposed in an image plane 20 of the projection lens 10.

In FIG. 1, initially unpolarized projection light 22, as indicated by broken lines, is generated by an illumination system, not shown, of the projection exposure apparatus and has a wavelength λ=157 nm in the exemplary embodiment shown. The projection light 22 enters, after passing through the reticle 12 and two optical elements not denoted in greater detail, a catadioptric section 26 that is separated from the remaining part by a beam-splitter cube 24.

In the beam-splitter cube 24, a first polarization component of the projection light 22 is reflected at a polarization-selective beam-splitter layer 28 contained therein. This component impinges, after passing a lens L1, a quarter-wave plate 30, a grey filter 32 and two further lenses L2 and L3, onto a spherical imaging mirror 34. After reflection at the spherical imaging mirror 34, the projection light 22 again passes through the lenses L3 and L2, the grey filter 32, the quarter-wave plate 30 and also the lens L1 in the reverse order and impinges again on the polarization-selective beam-splitter layer 28. However, this time the polarized projection light 22 is not reflected, but transmitted since the polarization of the projection light beam is rotated through 90° by passing through the quarter-wave plate 30 twice.

From the beam-splitter cube 24, the projection light beam enters, via a plane mirror 36, a dioptric part of the projection lens 10 that is denoted in total by 38 and in which a plurality of optical elements not described in greater detail is disposed along an optical axis 40 of the projection lens 10.

In order to keep light losses due to absorption as low as possible, all the lenses of the projection lens 10 are made of fluorite ($CaF_2$) crystals. For the sake of simplicity, it is assumed that the delays caused by intrinsic birefringence are substantially compensated for by suitable orientation of the crystal lattices of the fluorite crystals. In the lens L2 in the catadioptric section 26, on the other hand, there is assumed to be a region indicated by 42 that is birefringent owing to mechanical stresses. The birefringence in the region 42 results in a disturbance of the polarization distribution in the catadioptric section 26 of the projection lens 10.

Figure 2:
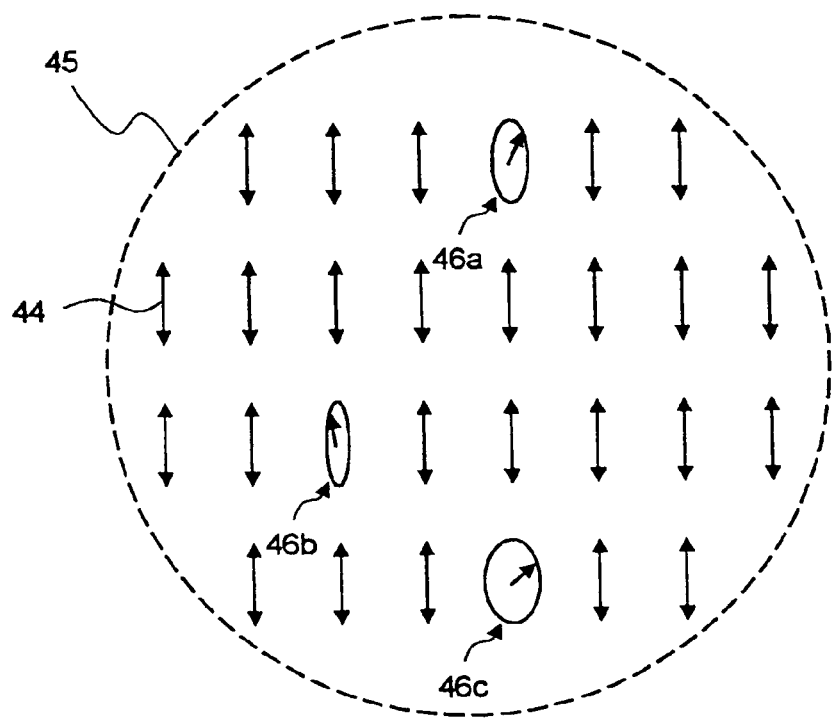
FIG. 2 shows a considerably simplified diagram of the polarization distribution of a light beam over its cross section along the line II—II of the projection lens in FIG. 1, only one propagation direction of the projection light being taken into account.

FIG. 2 shows diagrammatically a polarization distribution 45 of projection light 22 propagating in one direction at the level of a sectional plane indicated by II—II in FIG. 1. The projection light propagating in the opposite direction is polarized, at least approximately, perpendicularly thereto. Let arrows 44 represent the polarization direction within the light beam in this diagram. In FIG. 2, it can be seen that the projection light 22 is predominantly linearly polarized with the same polarization direction over the cross section of the light beam. At some points denoted by 46a, 46b and 46c in FIG. 2, the projection light 22 is, however, not precisely linearly, but more or less severely elliptically polarized. These local disturbances 46a, 46b, 46c of the polarization distribution are caused by the birefringent region 42 in the lens L2. The intensity of the projection light 22 is, however, constant over the entire cross section of the light beam.

When the projection light 22 having the polarization distribution shown in FIG. 2 enters the dioptric part 38 of the projection lens 10 through the polarization-selective beam-splitter layer 28, a local attenuation of the intensity and, consequently, intensity fluctuations occurs. This is due to the fact that the polarization-selective beam-splitter layer 28 is substantially only transparent to projection light having a polarization in the direction of the arrows 44. Projection light having a polarization component not extending along the arrows 44 is lost in this way. Since the disturbances 46a, 46b, 46c are not distributed uniformly over the entire cross section of the projection light beam, the intensity downstream of the beam-splitter layer 28 is not attenuated in its entirety, but only locally.

Figure 3:
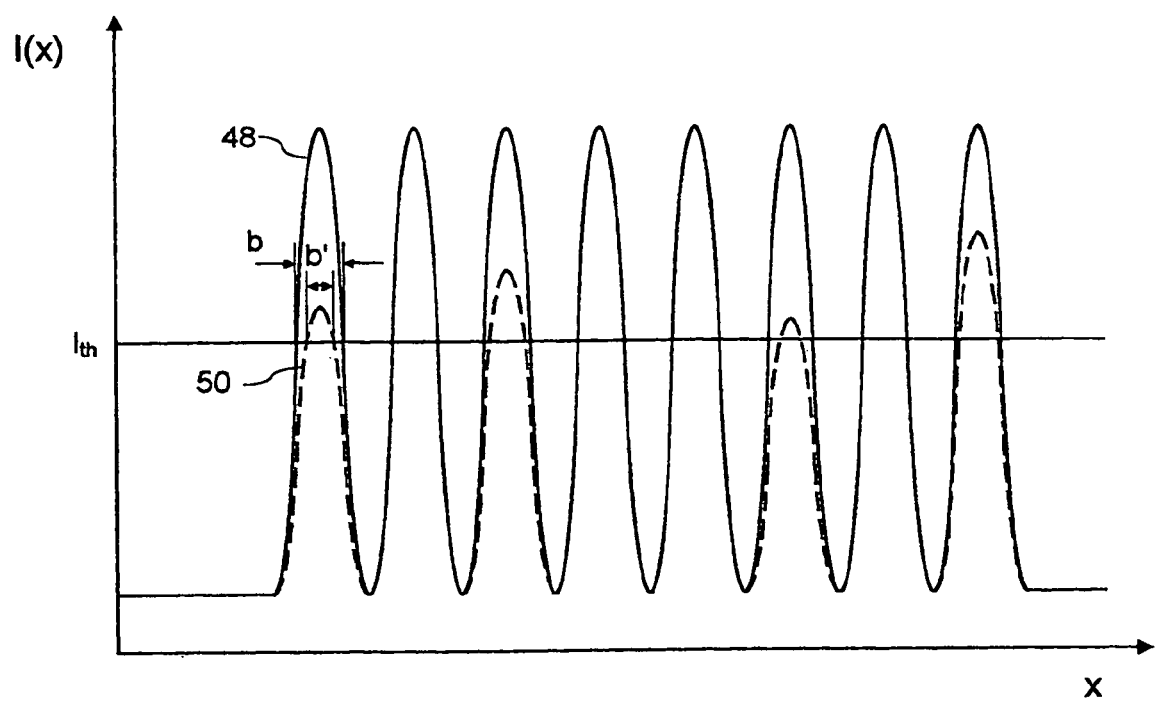
FIG. 3 shows a diagram in which the intensity of the projection light is plotted against one position coordinate in the image plane of the projection lens for a periodical reticle pattern.

How such intensity fluctuations affect the exposure of the photosensitive layer 14 is shown diagrammatically in FIG. 3. In the latter, a one-dimensional intensity distribution I(x) denoted by 48 is plotted as a continuous line against position x, such as could be measured in the image plane 20. For the sake of simplicity, a periodic intensity distribution is assumed here, such as could be generated, for example, by a plurality of reticle patterns uniformly spaced apart from one another.

There is also plotted, as a broken line, the intensity distribution 50 in which local intensity fluctuations occur owing to the disturbances 46a, 46b and 46c in the polarization distribution 45. Since an exposure of the photosensitive layer requires an intensity threshold Ith to be exceeded, the line width b' is reduced at the points having reduced intensity compared with the line width b at points at which the intensity is not attenuated. The fluctuations in the intensity are consequently translated into fluctuations in the line width of the electrical circuit, which reduces its clock frequency.

To prevent these effects of the disturbances 46a, 46b, 46c, the grey filter 32 is provided in the projection lens 10 inside the catadioptric section 26. The grey filter 32 is interchangeably disposed in a filter holder 52 and has a locally varying grey value over its area. The grey filter 32 is a transmission filter that may be constructed, for example, as a thin, transparent plate having an absorbing layer applied to it. In this connection, the grey-value distribution, i.e. the spatial distribution of the transmittance, of the grey filter 32 is determined by the thickness variation of the absorbing layer.

Grey filters, such as those that are proposed in U.S. Pat. No. 6,061,188 for eliminating amplitude errors for projection lenses, are also suitable.

The grey-value distribution of the grey filter is determined in such a way that only those light rays are reduced in their intensity whose polarization is not disturbed. The greater the disturbance of a light ray is, the lower the grey value is and, consequently, the higher the transmittance of the grey filter 32 is.

To be more specific, the grey-value distribution can be determined as a function of the disturbances 46a, 46b and 46c on the same principles as those also used in the application of nano-aspheres of lenses to correct wave-front errors. Details relating to the methods used in this context are to be found, for example, in U.S. Pat. No. 6,268,903 B1, the entire disclosure of which is hereby incorporated herein by reference. In order to initially determine the disturbances 46a, 46b, 46c in the polarization distribution 45, the polarization distribution can be determined either by measurements or, if the causes of the disturbances are known, by simulations. In the case of simulation, it should be borne in mind that the region 48 causing the disturbances 46a, 46b, 46c is traversed twice by the projection light 22, namely once before and once after reflection at the imaging mirror 34, because of its position inside the catadioptric section 26 of the projection lens 10.

The arrangement of the grey filter 32 in the filter holder 52 has the advantage that the grey filter 32 can be replaced, if necessary, by a grey filter having another grey-value distribution. Another grey-value distribution may be necessary, for example, if the illumination-angle distribution in the object plane 18 is altered in order to improve the imaging of particular types of reticles 12.

Figure 4:
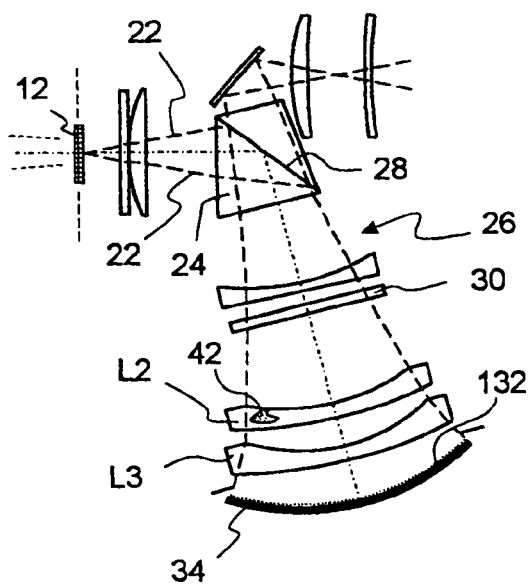
FIG. 4 is another exemplary embodiment of a projection lens according to the invention in a partial diagram corresponding to FIG. 1.

In the case of illumination systems that are not capable of altering the illumination-angle distribution in the object plane 18, the grey filter 32 may also be mounted in such a way in the projection lens 10 that it cannot readily be replaced. The surface of the imaging mirror 34, for example, is then also suitable as a position for the grey filter. In the detail of the projection lens 10 shown in FIG. 4, the grey filter is denoted by 132 and is indicated by a dotted line.

Figure 5:
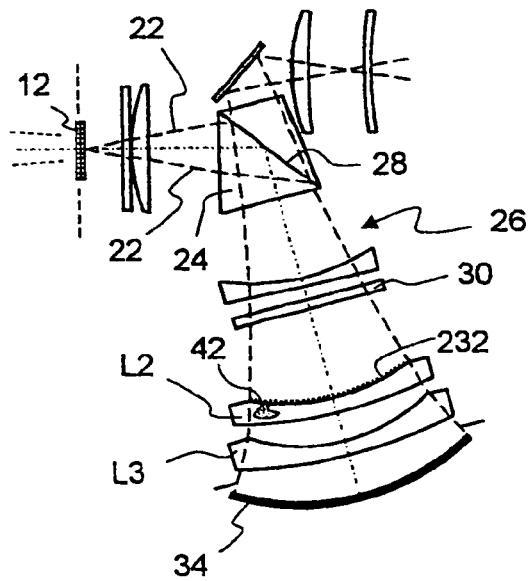
FIG. 5 is a further exemplary embodiment of a projection lens according to the invention in a partial diagram corresponding to FIG. 1.

The detail shown in FIG. 5 shows a further possible position for the arrangement of the grey filter in the projection lens 10. In this exemplary embodiment the grey filter denoted by 232 is applied directly to the lens L2 that contains the birefringent region 42 causing the disturbances 46a, 46b, 46c. This position in the immediate vicinity of the region 42 is preferred for the arrangement of the grey filter 232 insofar as it is particularly simple at that point to attenuate systematically only those projection light rays whose polarization is undisturbed.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

What it claimed is:

1. A projection lens for a microlithographic projection exposure apparatus, comprising:
   a) a first optical element that has polarization dependent properties causing intensity fluctuations in an image plane of the projection lens, and
   b) a gray filter that reduces the intensity fluctuations.

2. The projection lens of claim 1, in which the first optical element disturbs the polarization state of at least one ray of projection light impinging on the first optical element.

3. The projection lens of claim 2, comprising a second optical element that is arranged downstream of the first optical element in the propagation direction of the projection light and has polarization dependent properties such that the intensity of projection light emerging from the second optical element depends on the polarization state of projection light impinging thereon.

4. The projection lens of claim 3, in which the second optical element attenuates the intensity of light rays, whose polarization state is disturbed by the first optical element, to a larger amount than the intensity of light rays, whose polarization state is less disturbed by the first optical element.

5. The projection lens of claim 4, in which the gray filter attenuates the intensity of light rays, whose polarization state is disturbed by the first optical element, to a smaller degree than the intensity of light rays, whose polarization state is less disturbed by the first optical element.

6. The projection lens of claim 1, in which the gray filter is a transmissive optical element having a locally varying transmittance.

7. The projection lens of claim 1, in which the gray filter is a reflective optical element having a locally varying reflectance.

8. The projection lens of claim 1, in which the gray filter does not modify the phase distribution of the projection light passing through.

9. The projection lens of claim 1, in which the gray filter is disposed on the first optical element.

10. The projection lens of claim 3, in which the gray filter is disposed in the beam path between the first optical element and the second optical element.

11. The projection lens of claim 3, further comprising a catadioptric section in which the first optical element, the second optical element and the gray filter are disposed.

12. The projection lens of claim 1, in which the gray filter is disposed interchangeably in a filter holder.

* * * * *